US012088948B2

(12) United States Patent
Lee

(10) Patent No.: US 12,088,948 B2
(45) Date of Patent: Sep. 10, 2024

(54) GRAY CODE-TO-BINARY CODE CONVERTER AND DEVICES INCLUDING THE SAME

(71) Applicant: Samsung Electronics Co., Ltd., Suwon-si (KR)

(72) Inventor: Hyeokjong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 86 days.

(21) Appl. No.: 18/064,585

(22) Filed: Dec. 12, 2022

(65) Prior Publication Data

US 2023/0262363 A1    Aug. 17, 2023

(30) Foreign Application Priority Data

Feb. 11, 2022  (KR) .................. 10-2022-0018462
Jun. 28, 2022   (KR) .................. 10-2022-0079026

(51) Int. Cl.
*H04N 25/78*     (2023.01)
*H03M 7/16*      (2006.01)
*H04N 25/616*    (2023.01)

(52) U.S. Cl.
CPC .............. *H04N 25/78* (2023.01); *H03M 7/16* (2013.01); *H04N 25/616* (2023.01)

(58) Field of Classification Search
CPC ...... H04N 25/616; H04N 25/78; H04N 25/75; H03M 7/28; H03M 7/16
USPC ....................................................... 348/308
See application file for complete search history.

(56) References Cited

U.S. PATENT DOCUMENTS

| | | | |
|---|---|---|---|
| 9,357,147 B2* | 5/2016 | Nishida | H03M 1/12 |
| 9,369,644 B2 | 6/2016 | Higuchi et al. | |
| 9,380,246 B2 | 6/2016 | Lee | |
| 9,762,836 B2* | 9/2017 | Kurose | H04N 25/772 |
| 10,638,079 B2* | 4/2020 | Koyama | H04N 25/60 |
| 10,841,524 B2 | 11/2020 | Hisamatsu et al. | |
| 10,904,466 B2* | 1/2021 | Lee | H03M 1/0872 |
| 10,992,309 B1 | 4/2021 | Lee | |
| 11,133,822 B2 | 9/2021 | Nakano | |
| 2013/0015329 A1* | 1/2013 | Iwaki | H03M 1/36 341/158 |
| 2013/0068931 A1* | 3/2013 | Iwaki | H04N 25/60 250/208.1 |
| 2013/0335609 A1* | 12/2013 | Higuchi | H04N 25/46 348/302 |
| 2015/0138408 A1* | 5/2015 | Lee | H04N 25/75 348/294 |

(Continued)

*Primary Examiner* — Pritham D Prabhakher
(74) *Attorney, Agent, or Firm* — Harness, Dickey & Pierce, P.L.C.

(57) ABSTRACT

A gray code-to-binary code converter includes multiple parallel-in parallel-out (PIPO) latches, each of the multiple PIPO latches configured to output a parallel output gray code by latching a parallel input gray code in response to a sampling signal, and a parallel-in serial-out (PISO) circuit including a first group of switches, the PISO circuit configured to convert the parallel output gray code, which is latched in the multiple PIPO latches, into a binary code, and sequentially output bits of the binary code in units of bit, from a least significant bit (LSB) of the binary code to a most significant bit (MSB) of the binary code, while changing an arrangement of the first group of switches.

20 Claims, 12 Drawing Sheets

(56) References Cited

U.S. PATENT DOCUMENTS

| | | | | |
|---|---|---|---|---|
| 2015/0189214 A1* | 7/2015 | Kurose | ............ | H01L 27/14612 |
| | | | | 250/208.1 |
| 2015/0326811 A1* | 11/2015 | Nishida | ................. | H04N 25/75 |
| | | | | 348/308 |
| 2019/0052827 A1* | 2/2019 | Koyama | ............... | H04N 25/745 |
| 2019/0098234 A1* | 3/2019 | Lee | ..................... | H04N 25/616 |
| 2021/0119639 A1* | 4/2021 | Lee | ..................... | H04N 25/772 |
| 2021/0160450 A1 | 5/2021 | Han et al. | | |

* cited by examiner

FIG. 4

(a) OUT<0> = B<0>

| SW4 | ON  | SW4a | OFF |
|-----|-----|------|-----|
| SW3 | ON  | SW3a | OFF |
| SW2 | ON  | SW2a | OFF |
| SW1 | ON  | SW1a | OFF |

$B<3> = G<3>$
$B<2> = G<3> \oplus G<2>$
$B<1> = G<3> \oplus G<2> \oplus G<1>$
$B<0> = G<3> \oplus G<2> \oplus G<1> \oplus G<0>$ (b) OUT<1> = B<1>

| SW4 | ON  | SW4a | OFF |
|-----|-----|------|-----|
| SW3 | ON  | SW3a | OFF |
| SW2 | ON  | SW2a | OFF |
| SW1 | OFF | SW1a | ON  |

$B<1> = G<3> \oplus G<2> \oplus G<1> \oplus 0$ (c) OUT<2> = B<2>

| SW4 | ON  | SW4a | OFF |
|-----|-----|------|-----|
| SW3 | ON  | SW3a | OFF |
| SW2 | OFF | SW2a | ON  |
| SW1 | OFF | SW1a | ON  |

$B<2> = G<3> \oplus G<2> \oplus 0 \oplus 0$ (d) OUT<3> = B<3>

| SW4 | ON  | SW4a | OFF |
|-----|-----|------|-----|
| SW3 | OFF | SW3a | ON  |
| SW2 | OFF | SW2a | ON  |
| SW1 | OFF | SW1a | ON  |

$B<3> = G<3> \oplus 0 \oplus 0 \oplus 0$

FIG. 6

RESET SAMPLING OPERATION

| RW4 | OFF | RW4a | ON |
|---|---|---|---|
| RW3 | OFF | RW3a | ON |
| RW2 | OFF | RW2a | ON |
| RW1 | OFF | RW1a | ON |

FIG. 7

LIGHT-SENSING SIGNAL OPERATION

DATA<0> = SIG_B<0> - RST_B<0>

| RW4 | OFF | RW4a | ON |
|---|---|---|---|
| RW3 | OFF | RW3a | ON |
| RW2 | OFF | RW2a | ON |
| RW1 | ON | RW1a | OFF |

(a)

DATA<1> = SIG_B<1> - RST_B<1>

| RW4 | OFF | RW4a | ON |
|---|---|---|---|
| RW3 | OFF | RW3a | ON |
| RW2 | ON | RW2a | OFF |
| RW1 | OFF | RW1a | ON |

(b)

DATA<2> = SIG_B<2> - RST_B<2>

| RW4 | OFF | RW4a | ON |
|---|---|---|---|
| RW3 | ON | RW3a | OFF |
| RW2 | OFF | RW2a | ON |
| RW1 | OFF | RW1a | ON |

(c)

DATA<3> = SIG_B<3> - RST_B<3>

| RW4 | ON | RW4a | OFF |
|---|---|---|---|
| RW3 | OFF | RW3a | ON |
| RW2 | OFF | RW2a | ON |
| RW1 | OFF | RW1a | ON |

(d)

GRAY CODE-TO-BINARY CODE CONVERTER AND DEVICES INCLUDING THE SAME

CROSS-REFERENCE TO RELATED APPLICATIONS

This application claims priority under 35 U.S.C. § 119 to Korean Patent Application No. 10-2022-0018462 filed on Feb. 11, 2022, and Korean Patent Application No. 10-2022-0079026 filed on Jun. 28, 2022, in the Korean Intellectual Property Office, the disclosures of each of which are incorporated by reference herein in their entireties.

FIELD

Some example embodiments of the inventive concepts relate to a gray code-to-binary code converter, including a gray code-to-binary code converter that converts a parallel gray code into a parallel binary code and then sequentially outputs bits of the parallel binary code from the least significant bit (LSB) of the parallel binary code to the most significant bit (MSB) of the parallel binary code in units of bit, and/or devices including the same.

BACKGROUND

An image sensor is a device that captures an image by using properties of a semiconductor responding to light. With the development of a CMOS technology, CMOS image sensors using the CMOS technology are being widely used.

Each of the CMOS image sensors desires or requires an operation of converting an analog pixel signal output from an active pixel sensor (APS) array into a digital pixel signal. For this conversion, each of the CMOS image sensors uses an analog-to-digital converter (ADC).

According to an analog-to-digital conversion method, the CMOS image sensors are divided into a CMOS image sensor using a single ADC method and a CMOS image sensor using a column ADC method.

The single ADC method refers to a method of converting analog pixel signals output from all column lines of the APS array into digital pixel signals within a desired (or alternatively predetermined) time by using one ADC operating at high speed. The single ADC method has the reduced chip area in which an ADC is implemented. However, the single ADC method has high power consumption because the ADC needs to operate at high speed. On the other hand, the column ADC method refers to a method of arranging an ADC having a simple structure in each column, and has power consumption lower than the single ADC method.

A column ADC may include a counter. The counter compares a pixel signal output through the APS array with a ramp signal output from a ramp signal generator, and counts a state transition time of a comparison signal corresponding to the comparison result.

SUMMARY

Some example embodiments of the inventive concepts provide an analog-to-digital conversion circuit that converts a parallel gray code into a parallel binary code for high-speed operation and noise reduction and sequentially outputs bits of the parallel binary code from an LSB of the parallel binary code to an MSB of the parallel binary code in units of bit while changing the arrangement of switches, and devices including the same.

According to an example embodiment, a gray code-to-binary code converter includes multiple parallel-in parallel-out (PIPO) latches, each of the multiple PIPO latches configured to output a parallel output gray code by latching a parallel input gray code in response to a sampling signal, and a parallel-in serial-out (PISO) circuit including a first group of switches, the PISO circuit configured to convert the parallel output gray code, which is latched in the multiple PIPO latches, into a binary code, and sequentially output bits of the binary code in units of bit, from a least significant bit (LSB) of the binary code to a most significant bit (MSB) of the binary code, while changing an arrangement of the first group of switches.

According to an example embodiment, a correlated double sampling (CDS) circuit including a full adder including a first input terminal, and a gray code-to-binary code converter configured to convert a parallel input gray code into a binary code, and sequentially output bits of the binary code to the first input terminal of the full adder, from a least significant bit (LSB) of the binary code to a most significant bit (MSB) of the binary code in units of bit, while changing an arrangement of a first group of switches included in the gray code-to-binary code converter.

According to an example embodiment, an image sensor includes a pixel array including multiple pixels, each of the multiple pixels configured to generate a pixel signal by performing photoelectric conversion, and an analog-to-digital converter configured to receive the pixel signal output from at least one pixel of the multiple pixels, wherein the analog-to-digital converter includes a ramp signal generator configured to generate a ramp signal, a sampling circuit configured to generate a sampling signal by sampling the pixel signal output from the at least one pixel, using the ramp signal, and a gray code-to-binary code converter configured to receive a parallel input gray code generated by a gray code generator and convert the parallel input gray code into a binary code, and sequentially output bits of the binary code, from a least significant bit (LSB) of the binary code to a most significant bit (MSB) of the binary code in units of bit, while changing an arrangement of a first group of switches included in the gray code-to-binary code converter.

The gray code-to-binary code converter includes PIPO latches, each of which outputs a parallel output gray code by latching the parallel input gray code in response to the sampling signal, and a PISO circuit that converts the parallel output gray code latched in the PIPO latches into the binary code, and sequentially outputs the bits of the binary code from the LSB to the MSB while changing the arrangement of the switches of the first group.

The PISO circuit further includes a plurality of XOR gates, which are connected in series and each of which includes an output terminal connected to a first input terminal of a next stage. The switches of the first group connect second input terminals of the plurality of XOR gates thus connected in series to output terminals of the PIPO latches or a ground in response to switch signals of a first group, respectively.

BRIEF DESCRIPTION OF THE FIGURES

The above and other objects and features of the inventive concepts will become apparent by describing in detail example embodiments thereof with reference to the accompanying drawings.

FIG. 4 is a table for describing switch arrangements of a first switch circuit for describing an operation of the parallel gray code-to-serial binary code conversion circuit shown in FIG. 2.

FIG. 6 is a table for describing a switch arrangement of a second switch circuit included in a reset memory circuit shown in FIG. 5 in a reset sampling operation.

FIG. 7 is a table for describing switch arrangements of a second switch circuit included in a reset memory circuit shown in FIG. 5 in a light-sensing image sampling operation.

DETAILED DESCRIPTION

Figure 1:
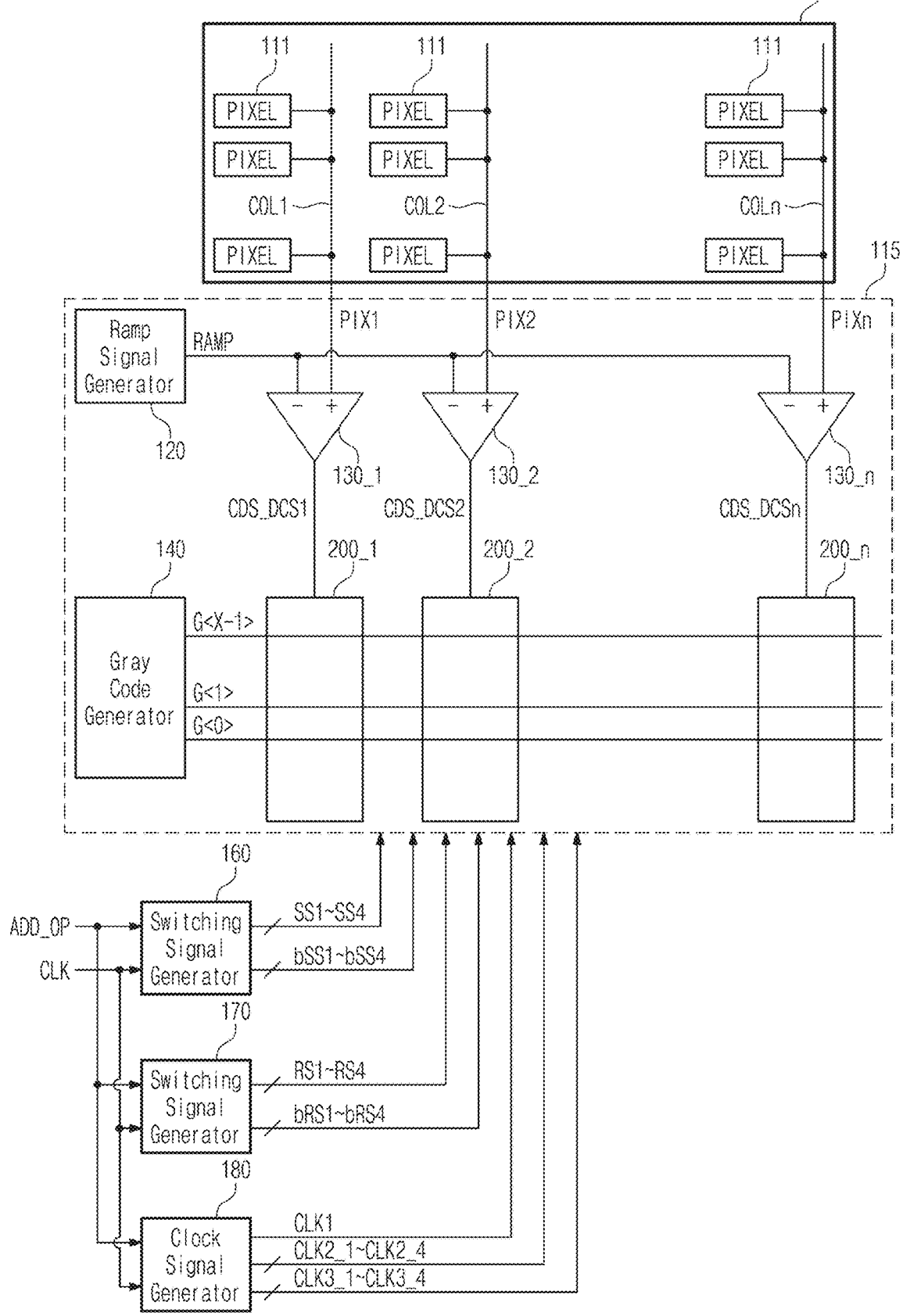
FIG. 1 is a block diagram of an image sensor including an analog-to-digital converter including a gray code-to-binary code converter that converts a parallel gray code into a serial binary code, according to an example embodiment of the inventive concepts.

FIG. 1 is a block diagram of an image sensor including an analog-to-digital converter including a gray code-to-binary code converter that converts a parallel gray code into a serial binary code, according to an example embodiment of the inventive concepts.

Referring to FIG. 1, an image sensor 100 includes a pixel array 110, an analog-to-digital converter 115, a first switching signal generator 160, a second switching signal generator 170, and a clock signal generator 180. The analog-to-digital converter 115 includes a ramp signal generator 120, a plurality of comparators 130_1, 130_2 to 130_n (here, 'n' is a natural number greater than or equal to 2), a gray code generator 140, and a plurality of correlated double sampling (CDS) circuits 200_1, 200_2 to 200_n. In some example embodiments, the CDS circuits 200_1 to 200_n may reduce noise in the electrical signal by subtracting a reference voltage of the pixel (e.g., a voltage of the pixel after reset), from a signal voltage of the pixel (e.g., a voltage of the pixel at the end of integration), at the end of each integration period. The correlated double sampling may improve technical operation of the image sensor 100 by reducing or cancelling kTC noise (e.g., thermal noise associated with capacitance of a sensor).

The image sensor 100 may be a complementary metal-oxide-semiconductor (CMOS) image sensor, and may be referred to as a "solid-state imaging device".

The pixel array 110 (or an APS array) includes a plurality of pixels 111 arranged in a matrix shape, and each of the plurality of pixels 111 outputs a pixel signal (or an analog pixel signal) by performing photoelectric conversion.

Figure 2:
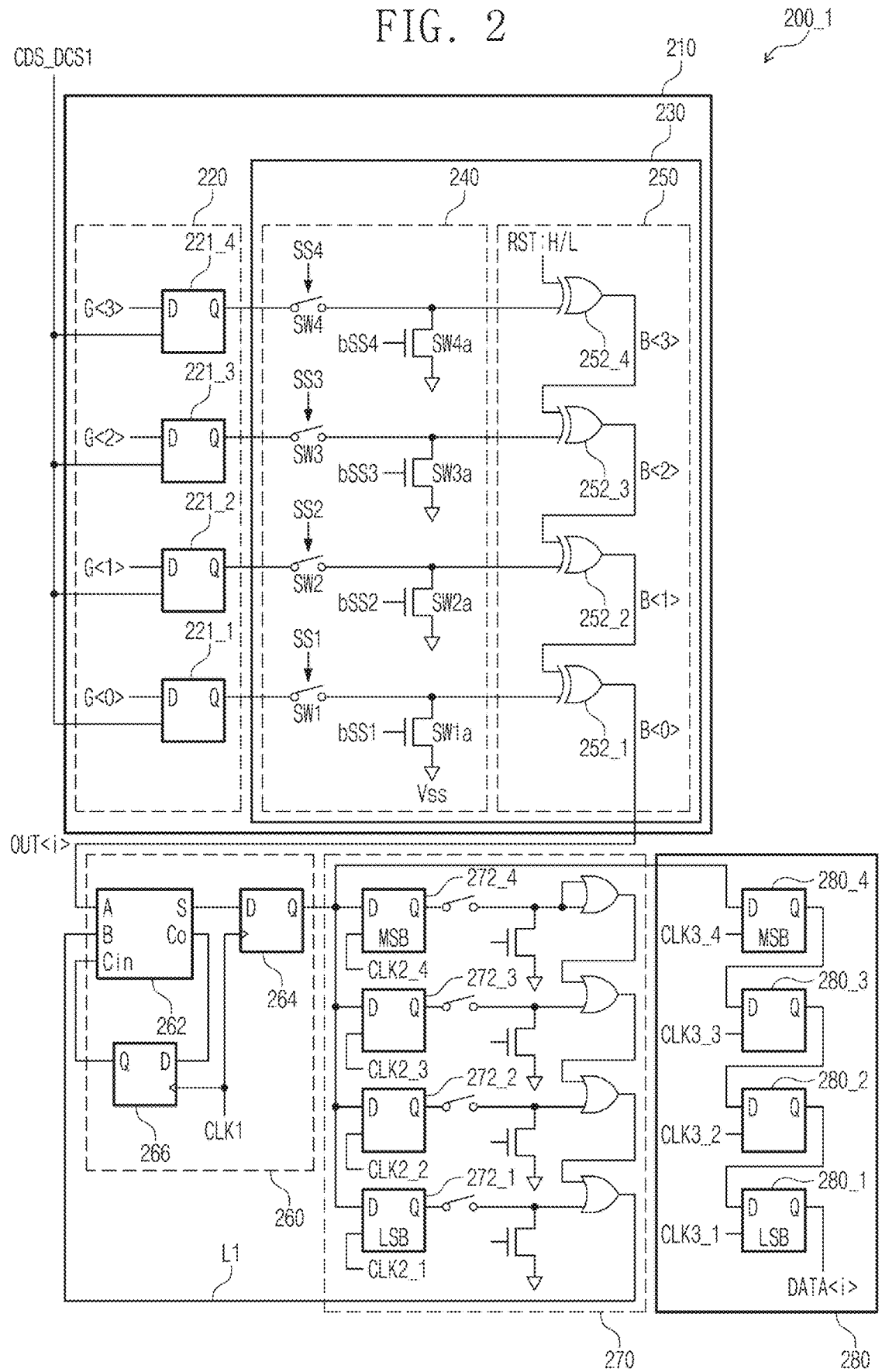
FIG. 2 is a block diagram of the first correlated double sampling (CDS) circuit shown in FIG. 1.

As shown in FIG. 2, the analog-to-digital converter 115 converts a parallel input gray code (G<0>, G<1>, G<2>, and G<3>) generated by the gray code generator 140 into a parallel output gray code (G<0>, G<1>, G<2>, and G<3>), again converts the parallel output gray code (G<0>, G<1>, G<2>, and G<3>) into a parallel binary code (B<0>, B<1>, B<2>, and B<3>), and sequentially outputs bits of the parallel binary code (B<0>, B<1>, B<2>, and B<3>) from an LSB to an MSB in units of bit through one output terminal by using a first group of switches SW1 to SW4 and SW1a to SW4a. In some example embodiments, use of gray code may improve technical operation of the image sensor 100 by reducing or preventing erroneous outputs from electromechanical switches. Gray code includes successive values that differ in only one bit, so incrementing each value may involve changing only a single bit, leading to less electromechanical errors during processing in the image sensor 100.

Figure 11:
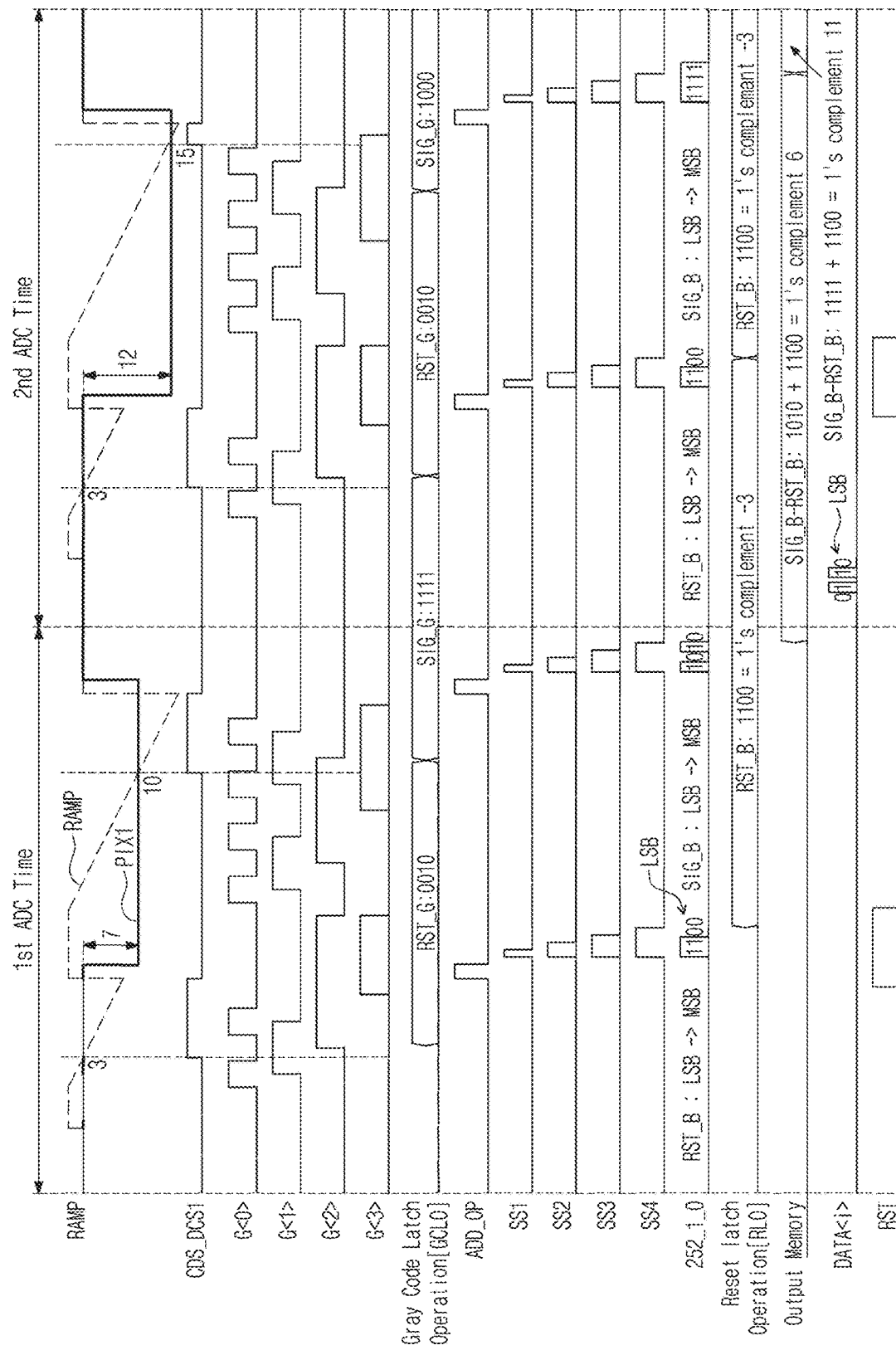
FIG. 11 is a timing diagram of signals for describing an operation of the first CDS circuit shown in FIG. 2.

The ramp signal generator 120 generates a ramp signal RAMP having a waveform shown in FIG. 11. The ramp signal generator 120 may be a digital-to-analog converter.

The comparators 130_1 to 130_n receive and compare pixel signals PIX1 to PIXn transmitted through column lines COL1 to COLn (or pixel lines) with the ramp signal RAMP, and then output comparison signals CDS_DCS1 to CDS_DCSn, respectively. Each of the pixel signals PIX1 to PIXn may include a reset signal and a light-sensing signal. For example, each of the comparators 130_1 to 130_n may be referred to as a "sampling circuit" that respectively generates the sampling signals CDS_DCS1 to CDS_DCSn by sampling the pixel signals PIX1 to PIXn by using the ramp signal RAMP.

In FIG. 1, it is illustrated that the ramp signal RAMP is input to a first input terminal (e.g., an inverting input terminal) of each of the comparators 130_1 to 130_n, and the pixel signals PIX1 to PIXn are respectively input to second input terminals (e.g., non-inverting input terminals) of the comparators 130_1 to 130_n.

According to some example embodiments, the ramp signal RAMP may be input to the second input terminal of each of the comparators 130_1 to 130_n, and the pixel signals PIX1 to PIXn may be respectively input to first input terminals of the comparators 130_1 to 130_n.

FIG. 11 illustrates a waveform of the first comparison signal CDS_DCS1 at a point in time when the ramp signal RAMP is input to the first input terminal of the first comparator 130_1 and the first pixel signal PIX1 is input to the second input terminal of the first comparator 130_1. However, a waveform of the first comparison signal CDS_DCS1 at a point in time when the ramp signal RAMP is input to the second input terminal of the first comparator 130_1 and the first pixel signal PIX1 is input to the first input terminal of the first comparator 130_1 is opposite to a waveform of the first comparison signal CDS_DCS1 illustrated in FIG. 11.

The gray code generator 140 generates an X-bit parallel input gray code (G<0> to G<X−1>). Here, 'X' is a natural number of 2 or more.

Each of the CDS circuits 200_1 to 200_n receives the X-bit parallel input gray code (G<0> to G<X−1>). Each of the CDS circuits 200_1 to 200_n is also called a "conversion circuit" or "counter". Each of the CDS circuits 200_1 to 200_n may compare the ramp signal RAMP with each of the pixel signals PIX1 to PIXn, may count a state transition time of each of the comparison signals CDS_DCS1 to CDS_DCSn, and may generate a count value.

Hereinafter, for brevity of drawing and convenience of description, assuming that the gray code generator 140 of FIG. 1 generates a 4-bit parallel input gray code (G<0> to G<3>), the signal G<0> is an LSB of the 4-bit parallel input gray code, and the signal G<3> is an MSB of the 4-bit parallel input gray code.

The first switching signal generator 160 generates a first group of switch signals SS1 to SS4 and bSS1 to bSS4 by using an operation control signal ADD_OP and a clock signal CLK and outputs the first group of switch signals SS1 to SS4 and bSS1 to bSS4 to the analog-to-digital converter 115.

The switch signals SS1 and bSS1, SS2 and bSS2, SS3 and bSS3, and SS4 and bSS4 which are paired with each other are complementary signals. For example, the switch signal bSS1 to bSS4 may be signals generated by inverting the switch signals SS1 to SS4 by using inverters, respectively.

The second switching signal generator 170 generates a second group of switch signals RS1 to RS4, and bRS1 to bRS4 by using the operation control signal ADD_OP and the clock signal CLK and outputs the second group of switch signals RS1 to RS4, and bRS1 to bRS4 to the analog-to-digital converter 115.

The switch signals RS1 and bRS1, RS2 and bRS2, RS3 and bRS3, and RS4 and bRS4 which are paired with each other are complementary signals. For example, the switch signal bRS1 to bRS4 may be signals generated by inverting the switch signals RS1 to RS4 by using inverters, respectively. According to some example embodiments, the first switching signal generator 160 and the second switching signal generator 170 may be implemented as one switching signal generator.

The clock signal generator 180 generates a first clock signal CLK1 to be supplied to a serial binary adder 260 shown in FIG. 2, a second group of clock signals CLK2_1 to CLK2_4 to be supplied to a reset memory circuit 270 shown in FIG. 2, and a third group of clock signals CLK3_1 to CLK3_4 to be supplied to an output memory circuit 280 shown in FIG. 2 by using the operation control signal ADD_OP and the clock signal CLK.

FIG. 2 is a block diagram of the first CDS circuit shown in FIG. 1.

Referring to FIGS. 1 and 2, a first CDS circuit (or the first counter 200_1) includes a gray code-to-binary code converter 210 (which is referred to as a "G2B converter" or a "parallel gray code-to-serial binary code conversion circuit"), the serial binary adder 260, the reset memory circuit 270, and the output memory circuit 280.

The G2B converter 210 includes the first group of switches SW1 to SW4 and SW1a to SW4a. In addition, the G2B converter 210 converts the parallel output gray code (G<0> to G<3>), which is latched in parallel-in to parallel-out (PIPO) latches 221_1 to 221_4, into the parallel binary code (B<0> to B<3>) while simultaneously or substantially simultaneously outputting the LSB (B<0>) of the parallel binary code (B<0> to B<3>), and sequentially output, to the serial binary adder 260, bits of the parallel binary code (B<0> to B<3>) from the next bit B<1> of the LSB (B<0>) of the parallel binary code to the MSB (B<3>) of the parallel binary code in units of bit while changing the arrangement of the switches SW1 to SW4 and SW1a to SW4a of the first group.

In other words, the G2B converter 210 sequentially outputs bits of the parallel binary code (B<0> to B<3>) from the LSB (B<0>) of the parallel binary code (B<0> to B<3>) to the MSB (B<3>) of the parallel binary code (B<0> to B<3>) corresponding to the parallel input gray code (G<0> to G<3>) in units of bit by using the first group of switches SW1 to SW4 and SW1a to SW4a.

The G2B converter 210 includes a PIPO circuit 220 and a parallel-in to serial-out (PISO) circuit 230, and the PISO circuit 230 includes a first switch circuit 240 and an XOR circuit 250 (it is also referred to as a 'selection circuit').

The PIPO circuit 220 includes PIPO latches 221_1 to 221_4, each of which receives and latches the parallel input gray code (G<0> to G<3>) in response to the first comparison signal CDS_DCS1 and then outputs the parallel output gray code (G<0> to G<3>).

Figure 3:
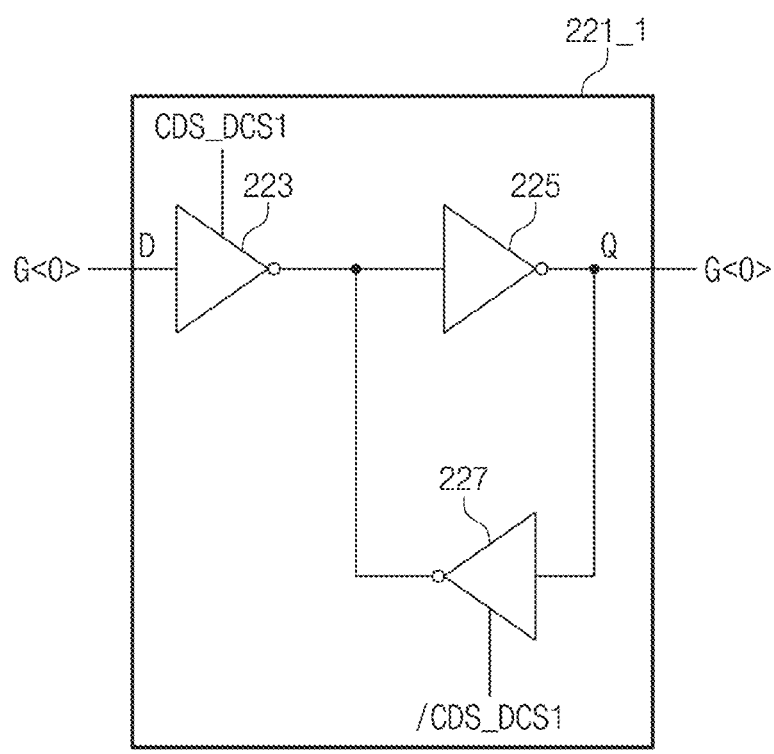
FIG. 3 is an example embodiment of a circuit diagram of the first latch shown in FIG. 2.

FIG. 3 is an embodiment of a circuit diagram of the first latch shown in FIG. 2.

Referring to FIGS. 2 and 3, the PIPO latches 221_1 to 221_4 has the same or substantially the same structure and operation as one another, and thus the structure and operation of the first latch 221_1 will be representatively described with reference to FIG. 3.

A structure of each of latches 272_1 to 272_4 of the reset memory circuit 270 is the same or substantially the same as that of the first latch 221_1. For example, the clock signal CLK2_1 is input to a control terminal of a first tri-state inverter 223 included in the latch 272_1, and an inverted clock signal /CLK2_1 is input to a control terminal of a second tri-state inverter 227 included in the latch 272_1. Moreover, the clock signal CLK2_4 is input to a control terminal of the first tri-state inverter 223 included in the latch 272_4, and an inverted clock signal /CLK2_4 is input to a control terminal of the second tri-state inverter 227 included in the latch 272_4.

A structure of each of latch 280_1 to 280_4 of the output memory circuit 280 is the same or substantially the same as that of the first latch 221_1. For example, the clock signal CLK3_1 is input to a control terminal of the first tri-state inverter 223 included in the latch 280_1, and an inverted clock signal /CLK3_1 is input to a control terminal of the second tri-state inverter 227 included in the latch 280_1. Moreover, the clock signal CLK3_4 is input to a control terminal of the first tri-state inverter 223 included in the latch 280_4, and an inverted clock signal /CLK3_4 is input to a control terminal of the second tri-state inverter 227 included in the latch 280_4.

The first latch 221_1 of FIG. 3 includes the first tri-state inverter 223, an inverter 225, and the second tri-state inverter 227.

An input terminal of the first tri-state inverter 223 is connected to an input terminal D of the first latch 221_1 that receives the first input gray signal G<0>. An input terminal of the inverter 225 is connected to an output terminal of the first tri-state inverter 223, and an output terminal of the inverter 225 is connected to an output terminal Q of the first latch 221_1 that outputs the first output gray signal G<0>.

An input terminal of the second tri-state inverter 227 is connected to the output terminal Q of the first latch 221_1, and an output terminal of the second tri-state inverter 227 is connected to the input terminal of the inverter 225.

Because a level of an inverted first comparison signal/CDS_DCS1 is low when a level of the first comparison signal CDS_DCS1 output from the first comparator 130_1 is high, the first tri-state inverter 223 is enabled, and the second tri-state inverter 227 is disabled. Accordingly, the first latch 221_1 outputs the first output gray signal G<0>.

However, because the level of the inverted first comparison signal/CDS_DCS1 is high when the level of the first comparison signal CDS_DCS1 output from the first comparator 130_1 is low, the first tri-state inverter 223 is disabled and the second tri-state inverter 227 is enabled. Accordingly, the first input gray signal (G<0>) is maintained by the inverter 225 and the second tri-state inverter 227 as it is.

The first switch circuit 240 includes the first group of switches SW1 to SW4 and SW1a to SW4a. Each of the switches SW1 to SW4 and SW1a to SW4a of the first group may be implemented with an NMOS transistor.

The first switch SW1 of the first group is connected between the output terminal Q of the first latch 221_1 and a second input terminal of a first XOR gate 252_1 (it is also referred to as an "output XOR gate" or "LSB XOR gate"), and the fifth switch SW1a of the first group is connected between the second input terminal of the first XOR gate 252_1 and a ground Vss.

The second switch SW2 of the first group is connected between the output terminal Q of the second latch 221_2 and a second input terminal of the second XOR gate 252_2, and the sixth switch SW2a of the first group is connected between the second input terminal of the second XOR gate 252_2 and the ground.

The third switch SW3 of the first group is connected between the output terminal Q of the third latch 221_3 and a second input terminal of the third XOR gate 252_3, and the seventh switch SW3a of the first group is connected between the second input terminal of the third XOR gate 252_3 and the ground.

The fourth switch SW4 of the first group is connected between the output terminal Q of the fourth latch 221_4 and a second input terminal of a fourth XOR gate 252_4 (it is also referred to as a "control XOR gate" or "MSB XOR gate"), and the eighth switch SW4a of the first group is connected between the second input terminal of the fourth XOR gate 252_4 and the ground.

The XOR circuit 250 includes the plurality of XOR gates 252_1 to 252_4. For example, each of the plurality of XOR gates 252_1 to 252_4 may be a 2-input 1-output XOR gate.

A first input terminal of the fourth XOR gate 252_4 receives a control signal RST, and an output terminal of the fourth XOR gate 252_4 is connected to a first input terminal of an XOR gate (e.g., the third XOR gate 252_3) of the next stage.

When the image sensor 100 performs a reset sampling operation of sampling a reset signal included in the first pixel signal PIX1, a level of the control signal RST is in logic high (H). When the image sensor 100 performs a signal sampling operation of sampling a light-sensing signal included in the first pixel signal PIX1, the level of the control signal RST is in logic low (L).

An output terminal of the third XOR gate 252_3 is connected to a first input terminal of an XOR gate (e.g., the second XOR gate 252_2) of the next stage; an output terminal of the second XOR gate 252_2 is connected to a first input terminal of an XOR gate (e.g., the first XOR gate 252_1) of the next stage; and, an output terminal of the first XOR gate 252_1 is connected to a first input terminal 'A' of a full adder 262.

Whenever the arrangement of the switches SW1 to SW4 and SW1a to SW4a of the first group is changed, the first XOR gate 252_1 sequentially outputs signals B<0>, B<1>, B<2>, and B<3> of the parallel binary code B<0> to B<3> in units of bit.

FIG. 4 is a table for describing switch arrangements of a first switch circuit for describing an operation of the parallel gray code-to-serial binary code conversion circuit shown in FIG. 2.

Referring to FIG. 2 and (a) of FIG. 4, in a first switch arrangement, the switches SW1 to SW4 are turned on in response to the switch signals SS1 to SS4, and the switches SW1a to SW4a are respectively turned OFF in response to the switch signals bSS1 to bSS4. At this time, each of switch pairs SW1 and SW1a, SW2 and SW2a, SW3 and SW3a, and SW4 and SW4a is designed not to be turned on at the same time.

Here, the switch arrangement means a state where the switches SW1 to SW4 and SW1a to SW4a are respectively turned on or off in response to levels of the switch signals SS1 to SS4 and bSS1 to bSS4.

The parallel output gray code (G<0>, G<1>, G<2>, and G<3>) latched in the PIPO latches 221_1 to 221_4 is simultaneously or substantially simultaneously transmitted to second input terminals of the XOR gates 252_1 to 252_4 depending on the first switch arrangement.

Referring to FIG. 11, the control signal RST is at a high level (or logic 1) in a reset sampling operation section of a first ADC time (1st ADC Time), and thus a parallel output gray code (RST_G=G<3>G<2>G<1>G<0>=0010) is converted into a parallel binary code (RST_B=B<3>B<2>B<1>B<0>=1100) by the XOR circuit 250.

However, the control signal RST is at a low level (or logic 0) in a signal sampling operation section of the first ADC time (1st ADC Time), and thus the parallel output gray code (SIG_G=G<3>G<2>G<1>G<0>=1111) is converted into a parallel binary code (SIG_B=B<3>B<2>B<1>B<0>=1010) by the XOR circuit 250.

The control signal RST is at a high level (or logic 1) in the reset sampling operation section of a second ADC time (2nd ADC Time), and thus the parallel output gray code (RST_G=G<3>G<2>G<1>G<0>=0010) is converted into the parallel binary code (RST_B=B<3>B<2>B<1>B<0>=1100) by the XOR circuit 250.

However, the control signal RST is at a low level (or logic 0) in a signal sampling operation section of the second ADC time (2nd ADC Time), and thus the parallel output gray code (SIG_G=G<3>G<2>G<1>G<0>=1000) is converted into a parallel binary code (SIG_B=B<3>B<2>B<1>B<0>=1111) by the XOR circuit 250.

The fourth XOR gate 252_4 outputs the binary signal B<3> by performing an XOR operation on the gray signal G<3> latched in the fourth latch 221_4 and the control signal RST.

In some example embodiments, when the output signal B<3> of the fourth XOR gate 252_4 is expressed as "G<3>" regardless of a level of the control signal RST, the output signals B<0> to B<3> of the XOR gates 252_1 to 252_4 are expressed as in Equation 1.

$$B<3>=G<3>$$

$$B<2>=G<3>\oplus G<2>$$

$$B<1>=G<3>\oplus G<2>\oplus G<1>$$

$$B<1>=G<3>\oplus G<2>\oplus G<1>\oplus G<0> \quad\quad \text{[Equation 1]}$$

The XOR circuit 250 converts the LSB (B<0>) of the parallel binary code (B<3>, B<2>, B<1>, and B<0>) as an output signal OUT<0> to the full adder 262.

After the LSB (B<0>) of the parallel binary code (B<3>, B<2>, B<1>, and B<0>) is output to the full adder 262, and then the first group of switches SW1 to SW4 and SW1a to SW4a has a second switch arrangement as shown in (b) of FIG. 4.

In the second switch arrangement, each of the switches SW2, SW3, SW4, and SW1a is turned on (ON) and each of the switches SW1, SW2a, SW3a, and SW4a is turned off (OFF).

Referring to FIG. 2 and (b) of FIG. 4, a second input terminal of the first XOR gate 252_1 is connected to a ground depending on the second switch arrangement.

When a logic value input to one input terminal of each of the 2-input 1-output XOR gates 252_1 to 252_4 is 0, a logic value of an output terminal of each of the 2-input 1-output XOR gates 252_1 to 252_4 is the same as a logic value input to the other input terminal.

An output signal (OUT<1>=B<1>) of the XOR circuit 250 is expressed as in Equation 2.

$$B<1>=G<3> \oplus G<2> \oplus G<1> \oplus 0 \quad \text{[Equation 2]}$$

The XOR circuit 250 outputs the output signal B<1> of the second XOR gate 252_2 to the full adder 262 as the output signal OUT<1>.

After the second signal B<1> of the parallel binary code (B<3>, B<2>, B<1>, and B<0>) is output to the full adder 262, the first group of switches SW1 to SW4 and SW1a to SW4a has a third switch arrangement as shown in (c) of FIG. 4.

In the third switch arrangement, each of the switches SW3, SW4, SW1a, and SW2a is turned on and each of the switches SW1, SW2, SW3a, and SW4a is turned off.

Referring to FIG. 2 and (c) of FIG. 4, a second input terminal of each of the XOR gates 252_1 and 252_2 is connected to the ground depending on the third switch arrangement.

The output signal (OUT<2>=B<2>) of the XOR circuit 250 is expressed depending on the third switch arrangement as in Equation 3.

$$B<2>=G<3> \oplus G<2> \oplus 0 \oplus 0 \quad \text{[Equation 3]}$$

The XOR circuit 250 outputs the output signal B<2> of the third XOR gate 252_3 to the full adder 262 as the output signal OUT<2>.

After the output signal B<2> of the third XOR gate 252_3 is output to the full adder 262, the first group of switches SW1 to SW4 and SW1a to SW4a has a fourth switch arrangement as shown in (d) of FIG. 4.

In the fourth switch arrangement, each of the switches SW4, SW1a, SW2a, and SW3a is turned on and each of the switches SW1, SW2, SW3, and SW4a is turned off.

Referring to FIG. 2 and (d) of FIG. 4, a second input terminal of each of the XOR gates 252_1, 252_2, and 252_3 is connected to the ground depending on the fourth switch arrangement.

The output signal (OUT<3>=B<3>) of the XOR circuit 250 is expressed depending on the fourth switch arrangement as in Equation 4.

$$B<3>=G<3> \oplus 0 \oplus 0 \oplus 0 \quad \text{[Equation 3]}$$

The XOR circuit 250 outputs the output signal B<3> (e.g., an MSB) of the fourth XOR gate 252_4 to the full adder 262 as the output signal OUT<3>.

As described above with reference to FIGS. 2 and 4, when the switch arrangement of the switches SW1 to SW4 and SW1a to SW4a of the first group is sequentially changed from the first switch arrangement to the fourth switch arrangement after the parallel input gray code (G<3>, G<2>, G<1>, and G<0>) is converted into the parallel binary code (B<3>, B<2>, B<1>, and B<0>), bits of the parallel binary code (B<3>, B<2>, B<1>, and B<0>) are sequentially output in units of bit from an LSB (B<0>) to an MSB (B<3>).

Returning to FIG. 2, the serial binary adder 260 includes the full adder 262, a first flip-flop 264, and a second flip-flop 266.

The serial binary adder 260 is a circuit that adds a 1-bit signal, which is input to the first input terminal 'A', and a 1-bit signal, which is input to the second input terminal 'B'. For example, as shown in FIG. 11, the serial binary adder 260 adds the serial binary code SIG_B, which is generated in the signal sampling operation, and the serial binary code RST_B, which is generated in the reset sampling operation.

The full adder 262 includes the first input terminal 'A' connected to the output terminal of the first XOR gate 252_1, the second input terminal 'B' for receiving (or directly receiving) an output signal of the reset memory circuit 270 through a transmission line L1, a carry-in terminal Cin, a carry-out terminal Co, and a sum terminal S'.

In response to a rising edge of the first clock signal CLK1, the first flip-flop 264 latches an output signal of the sum terminal S' of the full adder 262 and then outputs the latched output signal to the reset memory circuit 270.

In response to the rising edge of the first clock signal CLK1, the second flip-flop 266 latches the output signal of the carry-out terminal Co of the full adder 262 and then transmits (or feeds back) the latched output signal to the carry-in terminal Cin of the full adder 262. Each of the flip-flops 264 and 266 may be implemented with a D-flip-flop.

Figure 5:
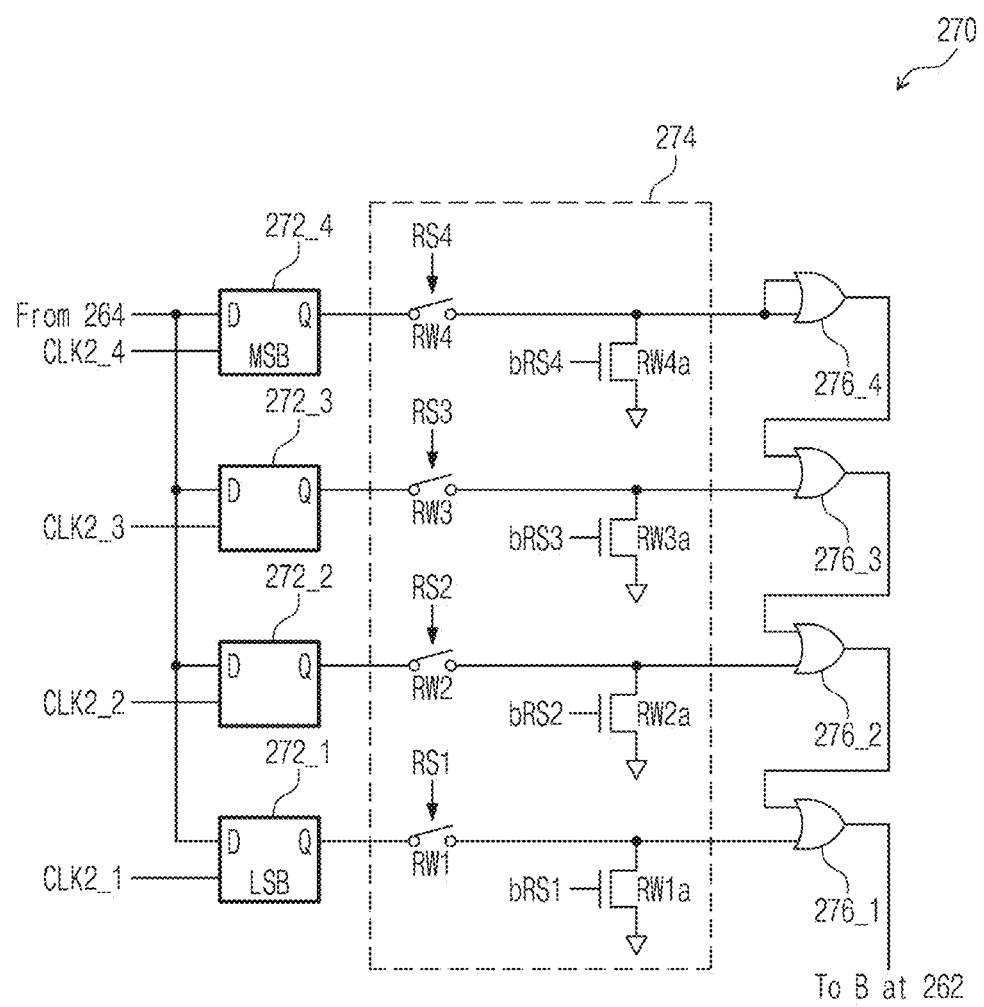
FIG. 5 is a detailed view of the reset memory circuit shown in FIG. 2.

FIG. 5 is a detailed view of the reset memory circuit shown in FIG. 2.

Referring to FIGS. 2 and 5, the reset memory circuit 270 includes the plurality of latches 272_1 to 272_4, a second switch circuit 274, and a plurality of OR gates 276_1 to 276_4.

Figure 8:
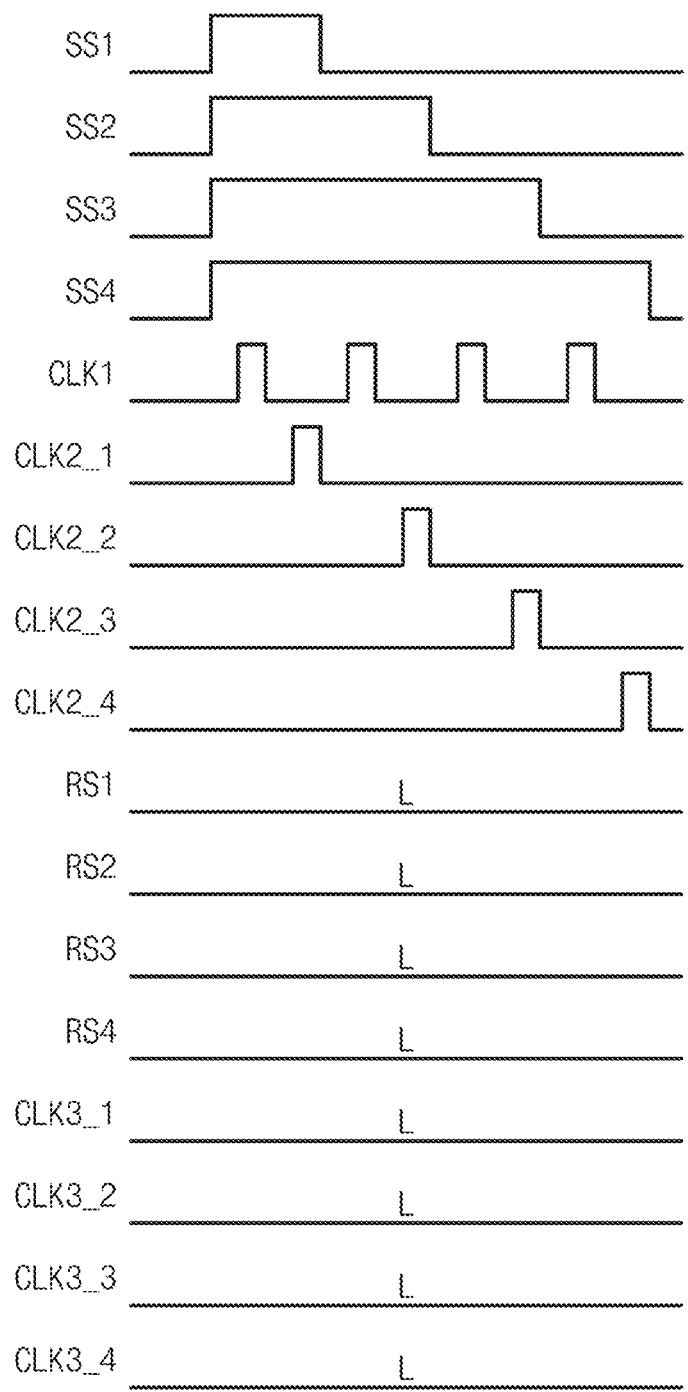
FIG. 8 is a timing diagram for describing a process of storing a parallel gray code, which is latched in parallel-in to parallel-out (PIPO) latches of the first CDS circuit shown in FIG. 2, in latches included in a reset memory circuit.

Each of the latches 272_1 to 272_4 latches an output signal of the first flip-flop 264 in response to the clock signals CLK2_1 to CLK2_4 shown in FIG. 8, respectively.

The second switch circuit 274 includes a second group of switches RW1 to RW4 and RW1a to RW4a. Each of the switches RW1 to RW4 and RW1a to RW4a of the second group may be implemented with an NMOS transistor.

The first switch RW1 of the second group is connected between an output terminal Q of the first latch 272_1 and a second input terminal of the first OR gate 276_1 (it is also referred to as an "output OR gate" or "LSB OR gate"), and the fifth switch RW1a of the second group is connected between the second input terminal of the first OR gate 276_1 and a ground Vss.

The second switch RW2 of the second group is connected between an output terminal Q of the second latch 272_2 and a second input terminal of the second OR gate 276_2, and the sixth switch RW2a of the second group is connected between the second input terminal of the second OR gate 276_2 and the ground.

The third switch RW3 of the second group is connected between an output terminal Q of the third latch 272_3 and a second input terminal of the third OR gate 276_3, and the seventh switch RW3a of the second group is connected between the second input terminal of the third OR gate 276_3 and the ground.

The fourth switch RW4 of the second group is connected between an output terminal Q of the fourth latch 272_4 and a second input terminal of the fourth OR gate 276_4, and the eighth switch RW4a of the second group is connected between the second input terminal of the fourth OR gate 276_4 and the ground.

Each of the OR gates 276_1 to 276_4 may be a 2-input 1-output OR gate.

Except for the first OR gate 276_1, output terminals of the plurality of 2-input 1-output OR gates 276_2 to 276_4, which are connected in series, are connected to first input terminals of the next OR gates 276_1 to 276_3, respectively.

A first input terminal of the fourth OR gate 276_4 is connected to a second input terminal of the fourth OR gate 276_4; an output terminal of the fourth OR gate 276_4 is connected to a first input terminal of the third OR gate 276_3; an output terminal of the third OR gate 276_3 is connected to a first input terminal of the second OR gate 276_2; an output terminal of the second OR gate 276_2 is connected to a first input terminal of the first OR gate 276_1; and, an output terminal of the first OR gate 276_1 is connected to the second input terminal 'B' of the full adder 262 through the transmission line L1.

The first latch 272_1 latches an LSB, and the fourth latch 272_4 latches an MSB.

FIG. 6 is a table for describing a switch arrangement of a second switch circuit included in a reset memory circuit shown in FIG. 5 in a reset sampling operation.

Referring to FIGS. 2, 5, 6, and 8, when the image sensor 100 performs a reset sampling operation, the second group of switches RW1 to RW4 and RW1a to RW4a has a fifth switch arrangement.

Depending on the fifth switch arrangement, each of the switches RW1a, RW2a, RW3a, and RW4a is turned on and each of the switches RW1, RW2, RW3, and RW4 is turned off. Accordingly, a second input terminal of each of the OR gates 276_1 to 276_4 is connected to a ground, and thus each of the OR gates 276_1 to 276_4 outputs logic 0.

FIG. 7 is a table for describing switch arrangements of a second switch circuit included in a reset memory circuit shown in FIG. 5 in a light-sensing image sampling operation.

Figure 9:
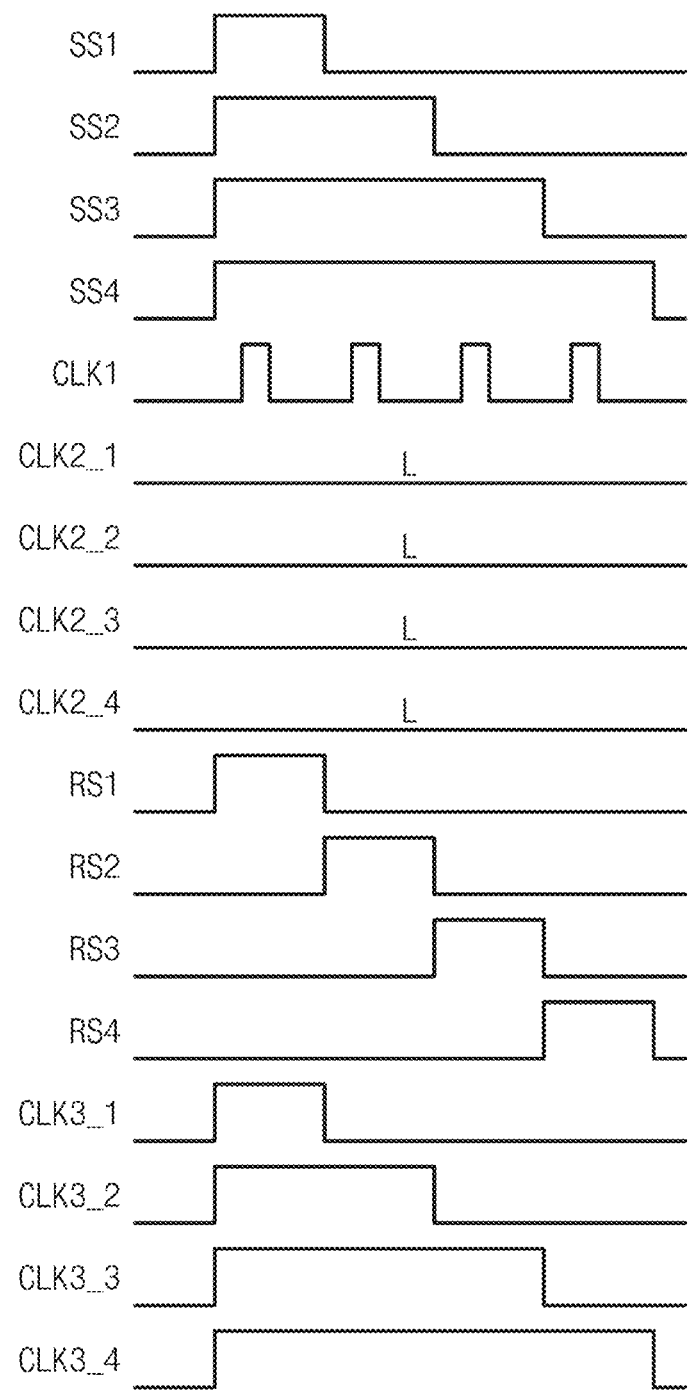
FIG. 9 is a timing diagram for describing a process of adding a parallel gray code latched in PIPO latches of the first CDS circuit shown in FIG. 2 and a parallel binary code stored in latches included in a reset memory circuit.

Referring to FIG. 2, FIG. 5, (a) of FIG. 7, and FIG. 9, depending on a sixth switch arrangement of the switches RW1 to RW4 and RW1a to RW4a of the second group, each of the switches RW1, RW2a, RW3a, and RW4a is turned on (ON) and each of the switches RW1a, RW2, RW3, and RW4 is turned off (OFF). Accordingly, an output signal of the first latch 272_1 is transmitted to a second input terminal of the first OR gate 276_1.

Referring to FIG. 2, FIG. 5, (b) of FIG. 7, and FIG. 9, depending on a seventh switch arrangement of the switches RW1 to RW4 and RW1a to RW4a of the second group, each of the switches RW1a, RW2, RW3a, and RW4a is turned on (ON) and each of the switches RW1, RW2a, RW3, and RW4 is turned off (OFF). Accordingly, an output signal of the second latch 272_2 is transmitted to a second input terminal of the second OR gate 276_2.

Referring to FIG. 2, FIG. 5, (c) of FIG. 7, and FIG. 9, depending on an eighth switch arrangement of the switches RW1 to RW4 and RW1a to RW4a of the second group, each of the switches RW1a, RW2a, RW3, and RW4a is turned on (ON) and each of the switches RW1, RW2, RW3a, and RW4 is turned off (OFF). Accordingly, an output signal of the third latch 272_3 is transmitted to a second input terminal of the third OR gate 276_3.

Referring to FIG. 2, FIG. 5, (d) of FIG. 7, and FIG. 9, depending on a ninth switch arrangement of the switches RW1 to RW4 and RW1a to RW4a of the second group, each of the switches RW1a, RW2a, RW3a, and RW4 is turned on (ON) and each of the switches RW1, RW2, RW3, and RW4a is turned off (OFF). Accordingly, an output signal of the fourth latch 272_4 is transmitted to a second input terminal of the fourth OR gate 276_4.

FIG. 8 is a timing diagram for describing a process of storing a parallel gray code, which is latched in PIPO latches of the first CDS circuit shown in FIG. 2, in latches included in a reset memory circuit Referring to FIGS. 2, 5, 8, and 11, a parallel input gray code (RST_G=G<3>G<2>G<1>G<0>=0010) is latched in the PIPO circuit 220 depending on a gray code latch operation (GCLO) in a reset sampling operation section of a first ADC time (1st ADC Time).

The control signal RST is at a high level, and thus a parallel output gray code (RST_G=G<3>G<2>G<1>G<0>=0010) is converted into a parallel binary code (RST_B=B<3>B<2>B<1>B<0>=1100) by the XOR circuit 250.

An LSB (B<0>=0) output depending on the first switch arrangement of switches SW1 to SW4 and SW1a to SW4a of the first group is latched in the first latch 272_1 in response to the clock signal CLK2_1; an output signal (B<1>=0) output depending on the second switch arrangement of switches SW1 to SW4 and SW1a to SW4a of the first group is latched in the second latch 272_2 in response to the clock signal CLK2_2; an output signal (B<2>=1) output depending on the third switch arrangement of switches SW1 to SW4 and SW1a to SW4a of the first group is latched in the third latch 272_3 in response to the clock signal CLK2_3; and an output signal (B<3>=1) output depending on the fourth switch arrangement of switches SW1 to SW4 and SW1a to SW4a of the first group is latched in the fourth latch 272_4 in response to the clock signal CLK2_4. In a reset latch operation (RLO), a 1's complement (1100) of '−3' is latched in the latches 272_1 to 272_4.

FIG. 9 is a timing diagram for describing a process of adding a parallel gray code latched in PIPO latches of the first CDS circuit shown in FIG. 2 and a parallel binary code stored in latches included in a reset memory circuit.

Referring to FIGS. 2, 5, 9, and 11, a parallel input gray code (SIG_G=G<3>G<2>G<1>G<0>=1111) is latched in the PIPO circuit 220 depending on a gray code latch operation (GCLO) in a signal sampling operation section of a first ADC time (1st ADC Time).

The control signal RST is at a low level, and thus a parallel output gray code (SIG_G=G<3>G<2>G<1>G<0>=1111) is converted into a parallel binary code (SIG_B=B<3>B<2>B<1>B<0>=1010) by the XOR circuit 250.

The serial binary adder 260 adds (SIG_B+RST_B), in units of bit, bits of a binary code (SIG_B=1010) output from the first XOR gate 252_1 in units of bit and bits of a binary code (RST_B=1100) output from the first OR gate 276_1 in units of bit and then latches the added result (SIG_B+RST_B=1010+1100=0110) in each of the latches 280_1 to 280_4 in response to each of the clock signals CLK3_1 to CLK3_4.

Referring to FIGS. 2, 5, 8, 9, and 11, a parallel input gray code (RST_G=G<3>G<2>G<1>G<0>=0010) is latched in the PIPO circuit 220 depending on a gray code latch operation (GCLO) in a reset sampling operation section of a second ADC time (2nd ADC Time).

The control signal RST is at a high level, and thus a parallel output gray code (RST_G=G<3>G<2>G<1>G<0>= 0010) is converted into a parallel binary code (RST_B=B<3>B<2>B<1>B<0>=1100) by the XOR circuit 250.

An LSB (B<0>=0) output depending on the first switch arrangement of switches SW1 to SW4 and SW1a to SW4a of the first group is latched in the first latch 272_1 in response to the clock signal CLK2_1; an output signal (B<1>=0) output depending on the second switch arrangement of switches SW1 to SW4 and SW1a to SW4a of the first group is latched in the second latch 272_2 in response to the clock signal CLK2_2; an output signal (B<2>=1) output depending on the third switch arrangement of switches SW1 to SW4 and SW1a to SW4a of the first group is latched in the third latch 272_3 in response to the clock signal CLK2_3; and an output signal (B<3>=1) output depending on the fourth switch arrangement of switches SW1 to SW4 and SW1a to SW4a of the first group is latched in the fourth latch 272_4 in response to the clock signal CLK2_4. In a reset latch operation (RLO), a 1's complement (1100) of '−3' is latched in the latches 272_1 to 272_4.

The parallel input gray code (SIG_G=G<3>G<2>G<1> G<0>=1000) is latched in the PIPO circuit 220 depending on a GCLO in a signal sampling operation section of a second ADC time (2nd ADC Time).

The control signal RST is at a low level, and thus a parallel output gray code (SIG_G=G<3>G<2>G<1>G<0>= 1000) is converted into a parallel binary code (SIG_B=B<3>B<2>B<1>B<0>=1111) by the XOR circuit 250.

The serial binary adder 260 adds (SIG_B+RST_B), in units of bit, bits of a binary code (SIG_B=1111) output from the first XOR gate 252_1 in units of bit and bits of a binary code (RST_B=1100) output from the first OR gate 276_1 in units of bit and then latches the added result (SIG_B+ RST_B=1111+1010=0011) in each of the latches 280_1 to 280_4 in response to each of the clock signals CLK3_1 to CLK3_4.

Figure 10:
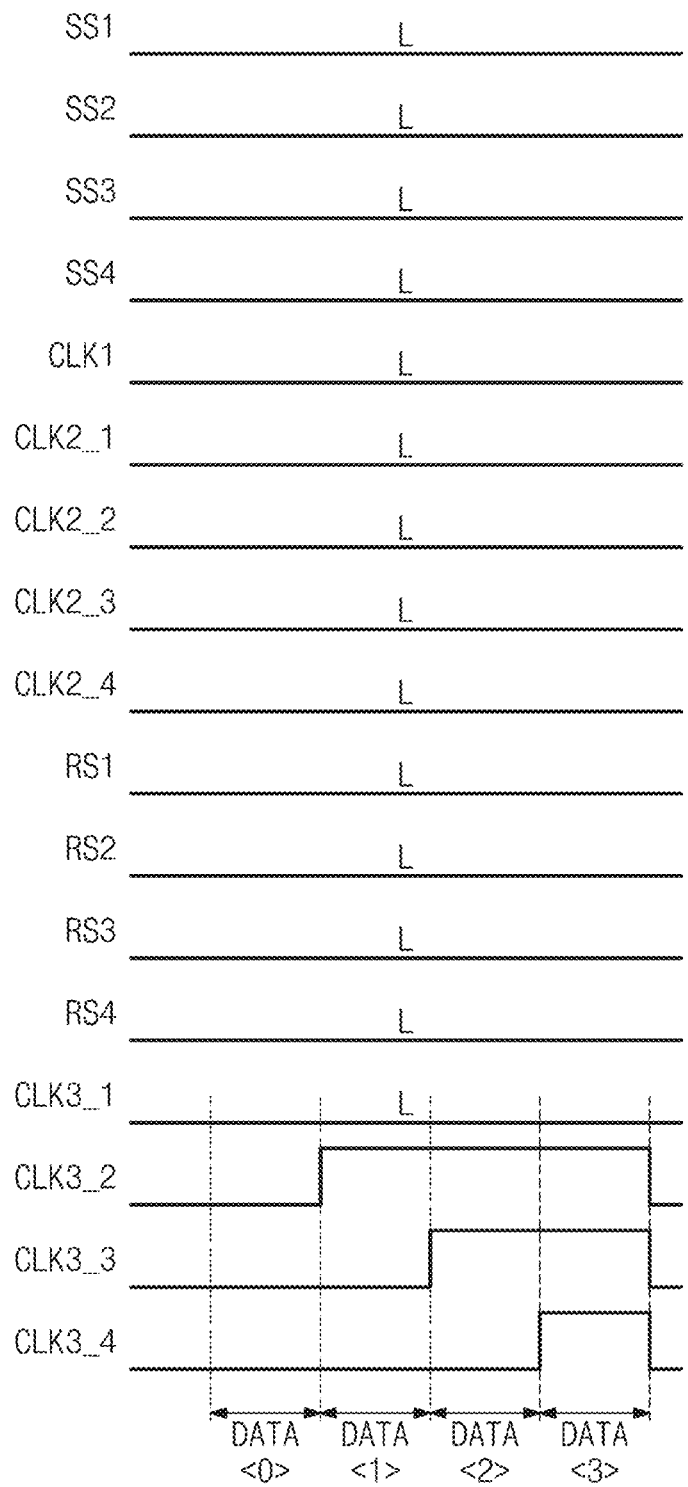
FIG. 10 is a timing diagram for describing a process of outputting, in units of bit, a code stored in latches included in an output memory circuit of the first CDS circuit shown in FIG. 2.

FIG. 10 is a timing diagram for describing a process of outputting, in units of bit, a code stored in latches included in an output memory circuit of the first CDS circuit shown in FIG. 2.

Referring to FIGS. 2, 5, 8, 9, 10, and 11, when each of the clock signals CLK3_1 to CLK3_4 is at a low level, the first latch 280_1 outputs a first signal DATA<0>.

When the second clock signal CLK3_2 transitions from a low level to a high level, the first latch 280_1 outputs the second signal DATA<1> latched in the second latch 280_2; when the third clock signal CLK3_3 transitions from a low level to a high level, the first latch 280_1 outputs the third signal DATA<2> latched in the third latch 280_3; and, when the fourth clock signal CLK3_4 transitions from a low level to a high level, the first latch 280_1 sequentially outputs the fourth signal DATA<3> latched in the fourth latch 280_4 in units of bit.

Figure 12:
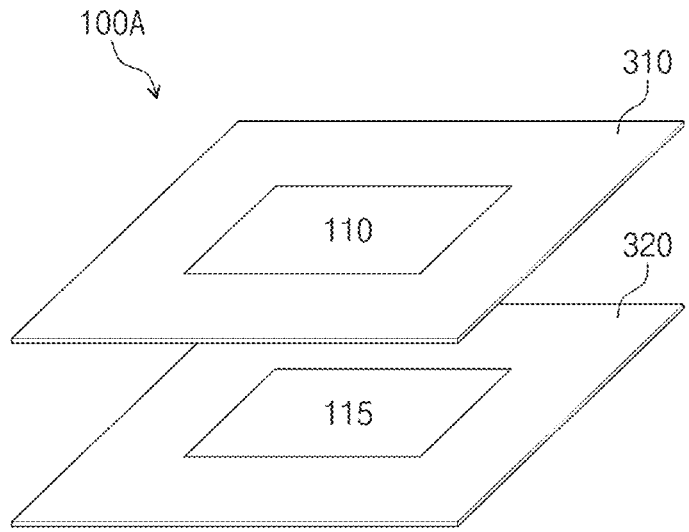
FIG. 12 is a block diagram of an image sensor including a pixel array implemented in a first semiconductor chip and an analog-to-digital conversion circuit implemented in a second semiconductor chip.

FIG. 12 is a block diagram of an image sensor including a pixel array implemented in a first semiconductor chip and an analog-to-digital conversion circuit implemented in a second semiconductor chip.

Referring to FIGS. 1 and 12, an image sensor 100A includes a first semiconductor chip 310 including the pixel array 110 and a second semiconductor chip 320 including the analog-to-digital converter 115. The pixel array 110 and the analog-to-digital converter 115 may be integrated in different semiconductor chips 310 and 320, respectively. In an example embodiment, the pixel array 110 and the analog-to-digital converter 115 may be integrated into one semiconductor chip.

Figure 13:
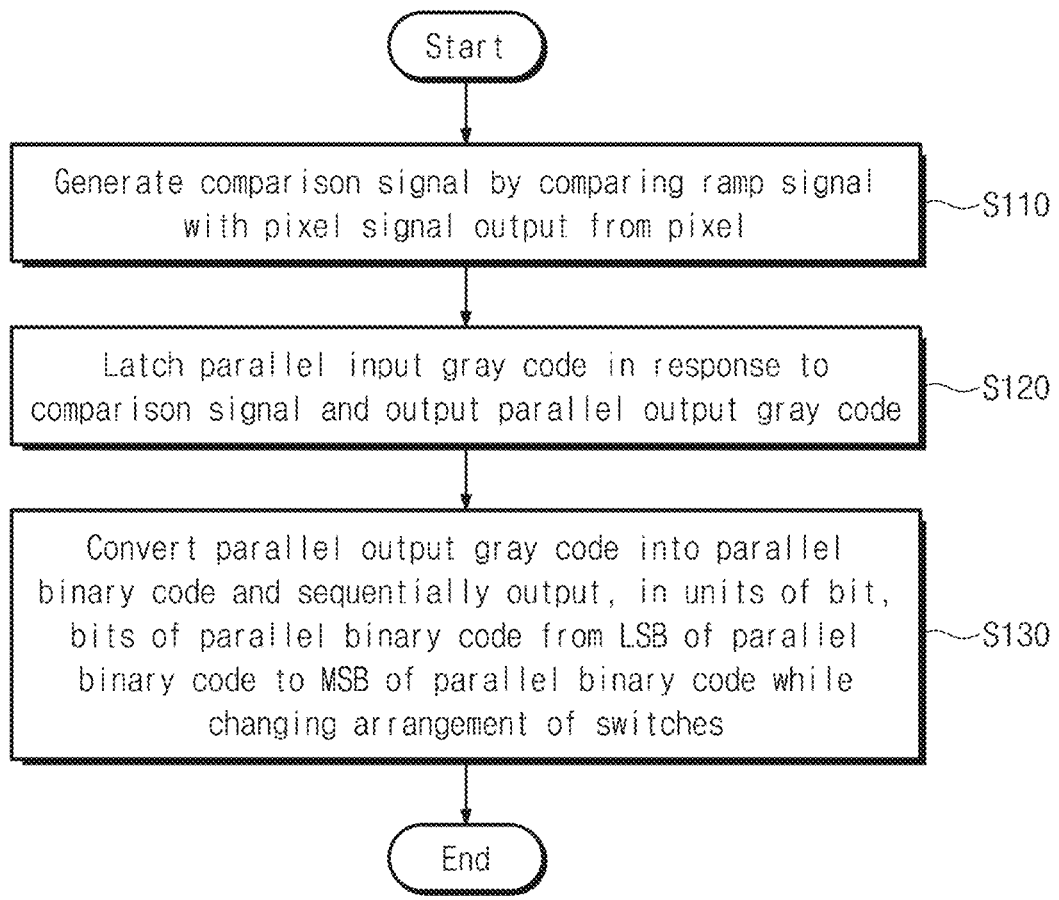
FIG. 13 is a flowchart for describing an operation of the first CDS circuit shown in FIG. 2.

FIG. 13 is a flowchart for describing an operation of the first CDS circuit shown in FIG. 2.

Referring to FIGS. 1 to 13, the first comparator 130_1 generates the first comparison signal CDS_DCS1 by comparing the ramp signal RAMP with the first pixel signal PIX1 output from the first column line COL1 (S110).

The parallel gray code-to-serial binary code conversion circuit 210 latches a parallel input gray code (G<0> to G<3>) in response to the comparison signal CDS_DCS1 and outputs a parallel output gray code (G<0> to G<3>) (S120).

The parallel gray code-to-serial binary code conversion circuit 210 includes the first group of switches SW1 to SW4 and SW1a to SW4a. In addition, the parallel gray code-to-serial binary code conversion circuit 210 converts the parallel output gray code (G<0> to G<3>), which is latched in the PIPO latches 221_1 to 221_4, into a parallel binary code (B<0> to B<3>) while simultaneously or substantially simultaneously outputting an LSB (B<0>) of the parallel binary code (B<0> to B<3>), and sequentially output, to the serial binary adder 260, bits of the parallel binary code (B<0> to B<3>) from the next bit B<1> of the LSB (B<0>) of the parallel binary code to the MSB (B<3>) of the parallel binary code in units of bit while changing the arrangement of the switches SW1 to SW4 and SW1a to SW4a of the first group.

Figure 14:
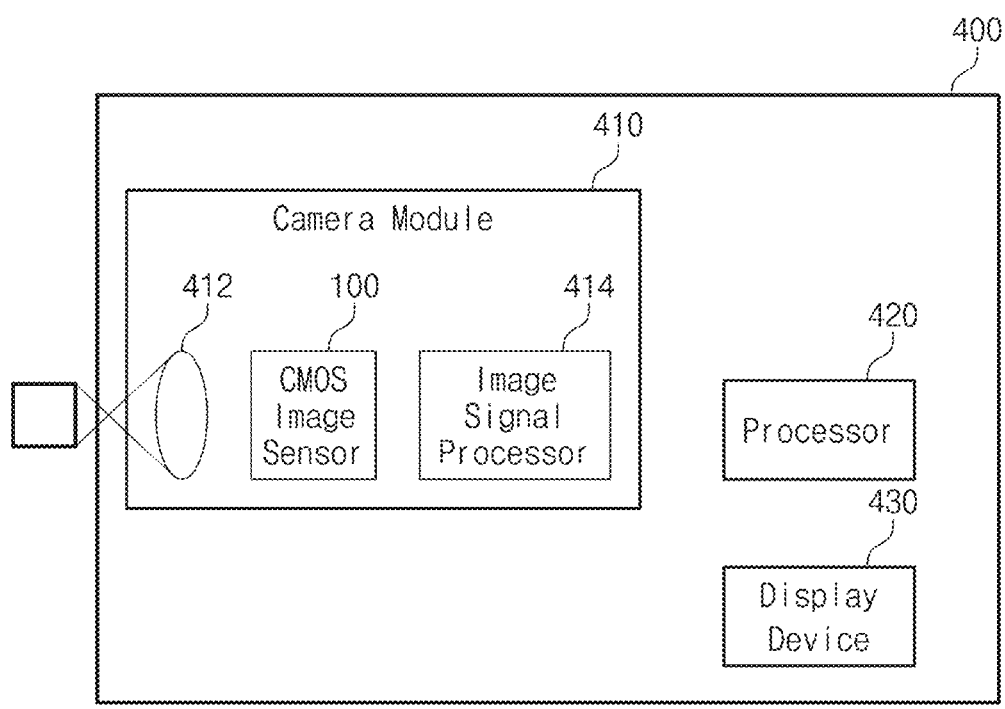
FIG. 14 is a block diagram of an image processing device including the image sensor shown in FIG. 1.

FIG. 14 is a block diagram of an image processing device including the image sensor shown in FIG. 1. Referring to FIG. 14, an image processing device 400 includes a camera module 410, a processor 420, and a display device 430.

The image processing device 400 may be used in a mobile device, a closed circuit television (CCTV) system, a wearable computer, or an in-vehicle infotainment system, but example embodiments are not limited thereto.

The image sensor 100 of the camera module 410 captures a subject by using a lens 412, generates an image signal corresponding to the captured subject, and transmits the image signal to an image signal processor 414. A structure of the image sensor 100 may correspond to a structure of the image sensor 100A described with reference to FIG. 12.

Image data processed by the image signal processor 414 may be transmitted to the processor 420, and the processor 420 may display an image corresponding to the processed image data through the display device 430.

The inventive concepts have been described with reference to some example embodiments shown in the drawings, but these are only example embodiments, and it will be understood that various modifications and other equivalent example embodiments are possible from this point by those skilled in the art.

According to an example embodiment of the inventive concepts, an analog-to-digital conversion circuit may convert a parallel gray code into a parallel binary code and then may directly and sequentially output, to a serial binary adder, bits of the parallel binary code from an LSB of the parallel binary code to an MSB of the parallel binary code in units of bit, while changing the arrangement of switches, thereby reducing noise while operating at high speed.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the inventive concepts have been described with reference to example embodiments thereof, it will be apparent to those of ordinary skill in the art that various changes and modifications may be made thereto without departing from the scope of the inventive concepts.

What is claimed is:

1. A gray code-to-binary code converter comprising:
    multiple parallel-in parallel-out (PIPO) latches, each of the multiple PIPO latches configured to output a parallel output gray code by latching a parallel input gray code in response to a sampling signal; and
    a parallel-in serial-out (PISO) circuit including a first group of switches, the PISO circuit configured to
    convert the parallel output gray code, which is latched in the multiple PIPO latches, into a binary code, and
    sequentially output bits of the binary code in units of bit, from a least significant bit (LSB) of the binary code to a most significant bit (MSB) of the binary code, while changing an arrangement of the first group of switches.

2. The gray code-to-binary code converter of claim 1, wherein the PISO circuit further includes:
    a plurality of XOR gates connected in series, each of the plurality of XOR gates including a first input terminal and an output terminal,
    wherein, in the plurality of XOR gates, the output terminal of a current stage is connected to the first input terminal of a next stage, and
    wherein the first group of switches connect second input terminals of the plurality of XOR gates to output terminals of the multiple PIPO latches or a ground, in response to switch signals of the first group.

3. The gray code-to-binary code converter of claim 2, wherein
    the sampling signal is a signal generated based on a comparison result of a comparison of a pixel signal output from a pixel and a ramp signal output from a ramp signal generator,
    a first input terminal of a MSB XOR gate of the plurality of XOR gates is configured to receive a control signal,
    during a reset sampling section for a reset signal included in the pixel signal output from the pixel, the control signal is maintained at a high level, and
    during a signal sampling section for a light-sensing signal included in the pixel signal output from the pixel, the control signal is maintained at a low level.

4. The gray code-to-binary code converter of claim 3, wherein
    a next stage of an LSB XOR gate of the plurality of XOR gates is a full adder, and
    an output terminal of the LSB XOR gate, which is configured to output the bits of the binary code from the LSB of the binary code to the MSB of the binary code, is connected to a first input terminal of the full adder.

5. A correlated double sampling (CDS) circuit comprising:
    a full adder including a first input terminal; and
    a gray code-to-binary code converter configured to
    convert a parallel input gray code into a binary code, and
    sequentially output bits of the binary code to the first input terminal of the full adder, from a least significant bit (LSB) of the binary code to a most significant bit (MSB) of the binary code in units of bit, while changing an arrangement of a first group of switches included in the gray code-to-binary code converter.

6. The CDS circuit of claim 5, wherein the gray code-to-binary code converter includes:
    multiple parallel-in parallel-out (PIPO) latches, each of the multiple PIPO latches configured to output a parallel output gray code by latching the parallel input gray code in response to a sampling signal; and
    a PISO circuit configured to
    convert the parallel output gray code latched in the multiple PIPO latches into the binary code; and
    sequentially output the bits of the binary code from the LSB to the MSB to the first input terminal of the full adder, while changing the arrangement of the first group of switches.

7. The CDS circuit of claim 6, wherein the PISO circuit further includes:
    a plurality of XOR gates connected in series, each of the plurality of XOR gates including a first input terminal and an output terminal, wherein, in the plurality of XOR gates, the output terminal of a current stage is connected to the first input terminal of a next stage, and
    wherein the first group of switches connect second input terminals of the plurality of XOR gates to output terminals of the multiple PIPO latches or a ground, in response to switch signals of the first group.

8. The CDS circuit of claim 7, wherein
    the sampling signal is a signal generated based on a comparison result of a comparison of a pixel signal output from a pixel and a ramp signal output from a ramp signal generator,
    a first input terminal of a MSB XOR gate of the plurality of XOR gates is configured to receive a control signal,
    during a reset sampling section for a reset signal included in the pixel signal output from the pixel, the control signal is maintained at a high level, and
    during a signal sampling section for a light-sensing signal included in the pixel signal output from the pixel, the control signal is maintained at a low level.

9. The CDS circuit of claim 6, wherein the full adder includes the first input terminal, a second input terminal for receiving an output signal of a reset memory circuit, a carry-in terminal, a carry-out terminal, and a sum terminal, the CDS circuit further comprising:
    a first flip-flop configured to output an output signal of the sum terminal to the reset memory circuit; and
    a second flip-flop configured to transmit an output signal of the carry-out terminal to the carry-in terminal.

10. The CDS circuit of claim 9, wherein the reset memory circuit includes:
    a plurality of latches, each of the plurality of latches configured to latch the output signal of the first flip-flop;
    a plurality of OR gates connected in series, each of the plurality of OR gates including a first input terminal and an output terminal, wherein, in the plurality of OR gates, the output terminal of a current stage is connected to the first input terminal of a next stage; and a second group of switches configured to connect second input terminals of the plurality of OR gates to output terminals of the plurality of latches or a ground, in response to switch signals of the second group, wherein a second input terminal of an MSB OR gate of the plurality of OR gates is connected to the first input terminal of the MSB OR gate, and wherein an output terminal of an LSB OR gate of the plurality of OR gates s is connected to the second input terminal of the full adder.

11. The CDS circuit of claim 10, further comprising:
multiple serial-in serial-out latches, each of the multiple serial-in serial-out latches connected to an output terminal of the first flip-flop.

12. An image sensor comprising:
a pixel array including multiple pixels, each of the multiple pixels configured to generate a pixel signal by performing photoelectric conversion; and
an analog-to-digital converter configured to receive the pixel signal output from at least one pixel of the multiple pixels,
wherein the analog-to-digital converter includes
a ramp signal generator configured to generate a ramp signal,
a sampling circuit configured to generate a sampling signal by sampling the pixel signal output from the at least one pixel, using the ramp signal, and
a gray code-to-binary code converter configured to receive a parallel input gray code generated by a gray code generator and convert the parallel input gray code into a binary code, and
sequentially output bits of the binary code, from a least significant bit (LSB) of the binary code to a most significant bit (MSB) of the binary code in units of bit, while changing an arrangement of a first group of switches included in the gray code-to-binary code converter.

13. The image sensor of claim 12, wherein the gray code-to-binary code converter includes:
multiple parallel-in parallel-out (PIPO) latches, each of the multiple PIPO latches configured to output a parallel output gray code by latching the parallel input gray code in response to the sampling signal; and
a PISO circuit configured to
convert the parallel output gray code latched in the multiple PIPO latches into the binary code, and
sequentially output the bits of the binary code from the LSB to the MSB, while changing the arrangement of the first group of switches.

14. The image sensor of claim 13, wherein the PISO circuit further includes:
a plurality of XOR gates connected in series, each of the plurality of XOR gates including a first input terminal and an output terminal, wherein, in the plurality of XOR gates, the output terminal of a current stage is connected to the first input terminal of a next stage, and wherein the first group of switches connect second input terminals of the plurality of XOR gates to output terminals of the PIPO latches or a ground, in response to switch signals of the first group.

15. The image sensor of claim 14, wherein
a first input terminal of a MSB XOR gate of the plurality of XOR gates is configured to receive a control signal,
during a reset sampling section for a reset signal included in the pixel signal, the control signal is maintained at a high level, and
during a signal sampling section for a light-sensing signal included in the pixel signal, the control signal is maintained at a low level.

16. The image sensor of claim 15, further comprising:
a full adder including the first input terminal connected to an output terminal of the PISO circuit, a second input terminal configured to receive an output signal of a reset memory circuit, a carry-in terminal, a carry-out terminal, and a sum terminal;
a first flip-flop configured to output an output signal of the sum terminal to the reset memory circuit; and
a second flip-flop configured to output an output signal of the carry-out terminal to the carry-in terminal.

17. The image sensor of claim 16, wherein the reset memory circuit includes:
a plurality of latches, each of the plurality of latches configured to latch the output signal of the first flip-flop;
a plurality of OR gates connected in series, each of the plurality of OR gates including a first input terminal and an output terminal, wherein, in the plurality of OR gates, the output terminal of a current stage is connected to the first input terminal of a next stage; and
a second group of switches configured to connect second input terminals of the plurality of OR gates to output terminals of the plurality of latches or the ground, in response to switch signals of the second group,
wherein a second input terminal of an MSB OR gate of the plurality of OR gates is connected to the first input terminal of the MSB OR gate, and
wherein an output terminal of an LSB OR gate of the plurality of OR gates is connected to the second input terminal of the full adder.

18. The image sensor of claim 17, further comprising:
multiple serial-in serial-out latches, each of the multiple serial-in serial-out latches connected to an output terminal of the first flip-flop.

19. The image sensor of claim 12, wherein
the pixel array is on a first semiconductor chip, and
the analog-to-digital converter is on a second semiconductor chip different from the first semiconductor chip.

20. An image processing device comprising:
the image sensor of claim 12; and
a processor configured to control an operation of the image sensor.

* * * * *